United States Patent [19]

Lierke et al.

[11] Patent Number: 4,962,330

[45] Date of Patent: Oct. 9, 1990

[54] ACOUSTIC TRANSDUCER APPARATUS WITH REDUCED THERMAL CONDUCTION

[75] Inventors: Ernst G. Lierke, Schwalbach/Taunus, Fed. Rep. of Germany; Emily W. Leung, La Canada; Balakrishna T. Bhat, Altadena, both of Calif.

[73] Assignee: The United States of America as represented by the Administrator of the National Aeronautics and Space Administration, Washington, D.C.

[21] Appl. No.: 326,756

[22] Filed: Mar. 21, 1989

[51] Int. Cl.[5] ............ H01L 41/08

[52] U.S. Cl. ............ 310/323; 310/325; 310/334; 181/0.5

[58] Field of Search ............ 310/321, 322, 323, 324, 310/325, 337; 181/0.5; 74/155; 73/505

[56] References Cited

U.S. PATENT DOCUMENTS

| | | | |
|---|---|---|---|
| 3,019,660 | 2/1962 | Welkowitz | 310/323 |
| 3,424,930 | 1/1969 | List | 310/338 |
| 3,555,297 | 1/1971 | Pierson | 310/338 X |
| 3,601,084 | 8/1971 | Biro et al. | 310/323 X |
| 3,689,783 | 9/1972 | Williams | 310/323 |
| 3,694,675 | 9/1972 | Loveday | 310/325 |
| 3,778,758 | 12/1973 | Carson | 310/323 |
| 3,882,732 | 5/1975 | Fletcher et al. | 181/0.5 X |
| 4,284,403 | 8/1981 | Rey | 181/0.15 X |
| 4,393,708 | 7/1983 | Barmatz | 181/0.5 X |
| 4,447,251 | 5/1984 | Dunn et al. | 181/0.5 X |
| 4,573,356 | 3/1986 | Barmatz | 73/505 |
| 4,735,096 | 4/1988 | Dorr | 310/325 X |
| 4,757,227 | 7/1988 | Danley et al. | 310/325 X |
| 4,841,495 | 6/1989 | Danley et al. | 181/0.5 X |

FOREIGN PATENT DOCUMENTS

| | | | |
|---|---|---|---|
| 876357 | 7/1971 | Canada | 310/323 |

*Primary Examiner*—Mark O. Budd
*Attorney, Agent, or Firm*—Thomas H. Jones; John R. Manning

[57] ABSTRACT

A horn is described for transmitting sound from a transducer to a heated chamber containing an object which is levitated by acoustic energy while it is heated to a molten state, which minimizes heat transfer to thereby minimize heating of the transducer, minimize temperature variation in the chamber, and minimize loss of heat from the chamber. The forward portion of the horn, which is the portion closest to the chamber, has holes that reduce its cross-sectional area to minimize the conduction of heat along the length of the horn, with the entire front portion of the horn being rigid and having an even front face to efficiently transfer high frequency acoustic energy to fluid in the chamber. In one arrangement, the horn has numerous rows of holes extending perpendicular to the length of horn, with alternate rows extending perpendicular to one another to form a sinuous path for the conduction of heat along the length of the horn.

5 Claims, 2 Drawing Sheets

FIG. 6
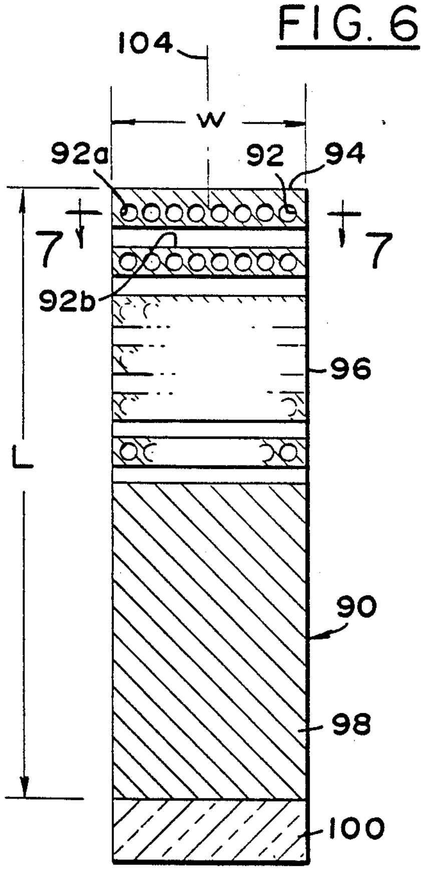
FIG. 7
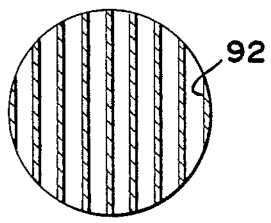
FIG. 8
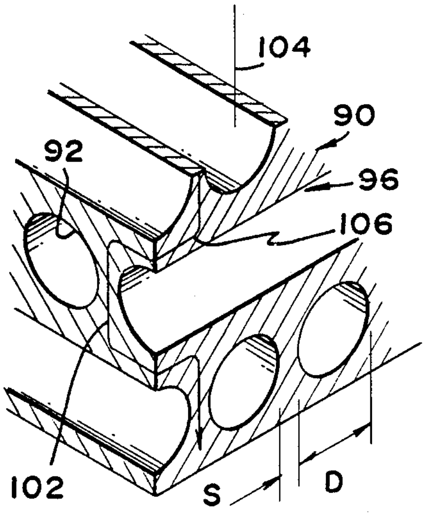
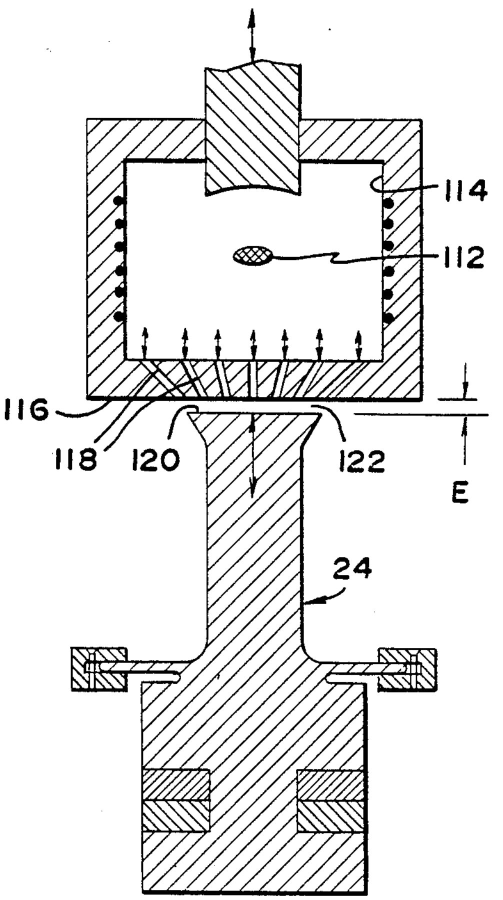
FIG. 9

ACOUSTIC TRANSDUCER APPARATUS WITH REDUCED THERMAL CONDUCTION

ORIGIN OF THE INVENTION

The invention described herein was made in the performance of work under a NASA contract, and is subject to the provisions of Public Law 96-517 (35 USC 202) in which the Contractor has elected not to retain title.

FIELD OF THE INVENTION

This invention relates to acoustic levitation and to horn-type transducer devices used therewith.

BACKGROUND ART

A promising technique for fabricating objects of ultrapure materials involves the use of acoustic energy to hold an object away from the walls of a chamber while the object is heated to a molten state, to avoid contamination of the object by the walls of the chamber. The process appears especially promising for fabrication in microgravity environments where only small levitation forces are required. One type of system includes a metal horn having a rearward portion coupled to a piezoelectric transducer that generates the acoustic energy, and a forward portion coupled to gas in the heated chamber. The horn efficiently couples the acoustic energy, and helps isolate the transducer from the hot chamber. However, where very high temperatures such as over 2000° C. are present in the chamber, there may be conductance of considerable heat through the horn and excessive heating of the transducer. A horn which minimized heat transmission while efficiently coupling acoustic energy from a transducer to the fluid in a chamber, would be of considerable value.

STATEMENT OF THE INVENTION

In accordance with one embodiment of the present invention, a sound transmitting horn is provided for transferring acoustic energy between a transducer and a heated chamber, which minimizes the reverse transfer of heat. The forward portion of the horn is perforated, to reduce its cross-sectional area thereby reducing the conduction of heat along its length, with the width of the horn still being large and the horn still being rigid up to near its extreme front end to sufficiently transmit higher frequency sound and energy. One or more holes may extend parallel to the length of the horn or in multiple rows extending perpendicular to the length of the horn. The holes can reduce the cross-sectional area at locations along the forward portion of the horn to less than half that which exists without the holes.

In another embodiment of the invention, a wall of the chamber is formed with holes through which sound can pass, and the front end of the horn lies a small distance from the outside walls of the chamber. Sound energy from the horn can pass through the chamber walls to the inside of the chamber, and yet heat transmission is reduced because heat must pass through an air (or other gas) gap before reaching the front face of the horn. The holes in the chamber walls can diverge in a direction away from the front end of the horn, to more efficiently carry sound energy to the chamber.

The novel features of the invention are set forth with particularity in the appended claims. The invention will be best understood from the following description when read in conjunction with the accompanying drawings.

BRIEF DESCRIPTION OF THE DRAWINGS

FIG. 6 is a sectional view of a horn constructed in accordance with another embodiment of the invention.

FIG. 7 is a view taken on the line 7—7 or FIG. 6.

FIG. 8 is a sectional perspective view of a portion of the horn of FIG. 6.

FIG. 9 is a sectional view of an acoustic levitation system constructed in accordance with another embodiment of the invention.

DETAILED DESCRIPTION OF THE INVENTION

Figure 1:
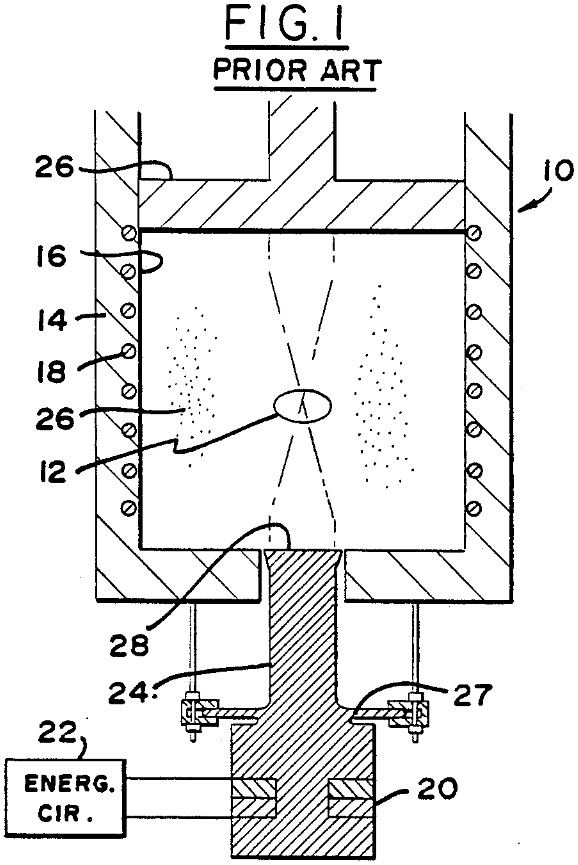
FIG. 1 PRIOR ART
FIG. 1 is a sectional view of an acoustic levitation system which includes a horn constructed and positioned in accordance with the prior art.

FIG. 1 shows a prior art levitating system 10 for holding an object 12 away from the walls 14 of a levitation chamber 16. Heating coils 18 can heat the object 12 to a molten temperature. The object is levitated by sonic energy from a transducer 20 such as a stack of piezoelectric discs driven by an energizing circuit 22, with the output of the transducer coupled through a horn 24 to the chamber. The chamber is filled with a fluid 26 such as nitrogen or other inert gas. The frequency of the sonic energy is chosen to establish a standing wave pattern within the chamber, which urges the object 12 towards a levitation position that is away from the chamber walls. The horn 24 is designed to transmit a particular frequency, and the dimensions of the chamber are variable as by use of a moving piston 26 so that the chosen frequency remains resonant to the chamber as the gas in the chamber is heated.

The system of FIG. 1 is especially useful for processing materials that have a very high melting temperature, such as in excess of 2000° C., where melting in a crucible is likely to cause contamination from the walls of the crucible. One problem that is encountered is that the horn 24, which is formed of a rigid material, generally metal, conducts heat well. The heat conduction can result in excessive heating of the transducer 20 which can damage it. In addition, the horn conducts considerable heat out of the chamber, resulting in an uneven temperature in the chamber, in the need for additional heating of the chamber, and in additional heating of the environment outside the chamber.

Figure 2:
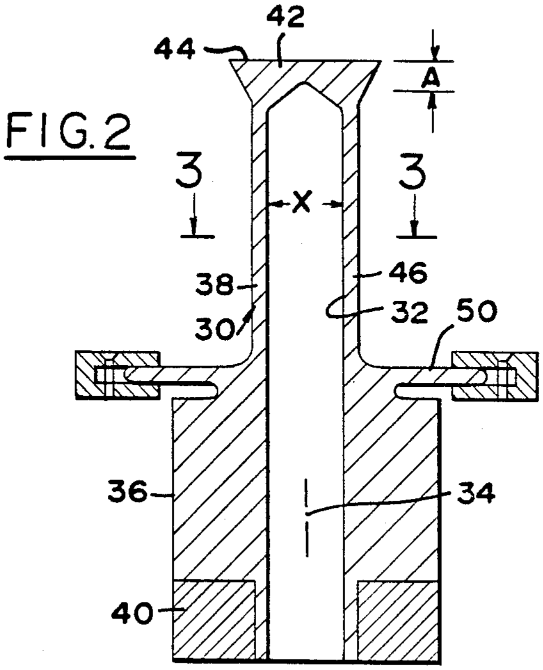
FIG. 2 is a sectional view of the horn or the present invention.

FIG. 2 illustrates another horn 30 constructed in accordance with one embodiment of the present invention, wherein the horn includes a hole 32 which reduces the cross-sectional area of much of the horn. The horn has an axis 34 extending along its length, and has rearward and forward portions 36, 38. The rearward portion 36 is coupled to a sonic transducer 40 while the forward portion is coupled to the chamber. The forward portion has a rigid extreme front end or cap 42 forming a continuous solid-to-fluid sound coupling surface 44. The hole 32 ends a distance A from the sound coupling surface 44, to assure that the forward end 42 is rigid and can efficiently couple vibrations transmitted along the solid outer portion 46 of the horn to the front surface. The average thickness A is at least 20% of the diameter X of the hole. Where the dimensions of the chamber are relatively small so that the frequency of the sound is of a fairly high frequency of a plurality of kilohertz, such as at least about 20 kHz, a rigid front end is required to efficiently transmit such higher frequency sound.

Figure 3:
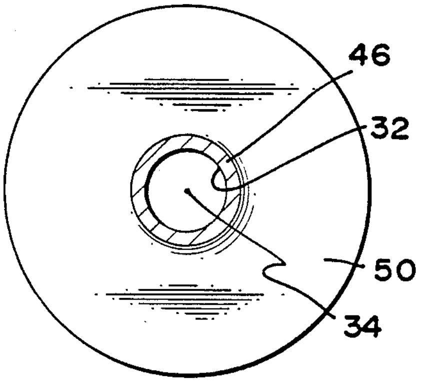
FIG. 3 is a view taken on the line 3—3 of FIG. 2, but without the mounting brackets.

The diameter of the hole is great enough to occupy over one-quarter and preferably a majority of the cross-sectional area of the horn as seen in FIG. 3. This results in a reduction of the cross section of the horn occupied by metal which conducts heat, to thereby minimize the rearward conduction of heat towards the transducer. The outer portion 46 of the horn which remains around the hole 32, is sufficiently rigid to efficiently transmit acoustic energy along the length of the horn to the rigid front end 42. The portion of the hole which lies along the forward portion 38 of the horn is especially useful in avoiding the rearward transfer of heat, since the forward portion of the horn is heated to the highest temperature. It may be noted that the forward portion 38 has a length, as measured between a mounting location 50 and the sound-coupling surface 44 equal to about one-quarter wave length of the sound transmitted through the horn. The hole 32 preferably also extends along the rearward 36 of the horn to reduce heat transference therealong.

Figure 4:
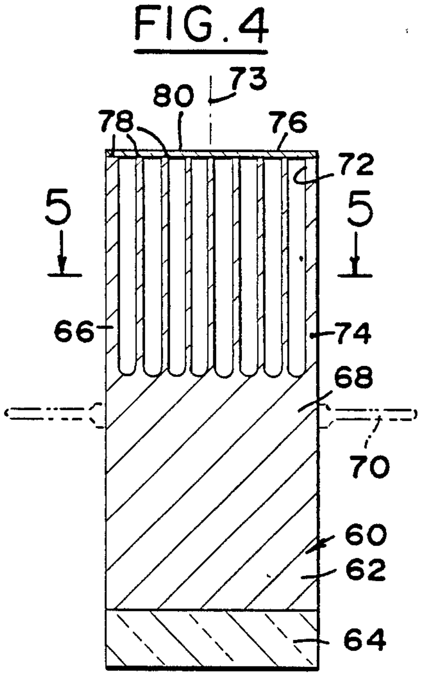
FIG. 4 is a sectional view of a horn constructed in accordance with another embodiment of the invention.
Figure 5:
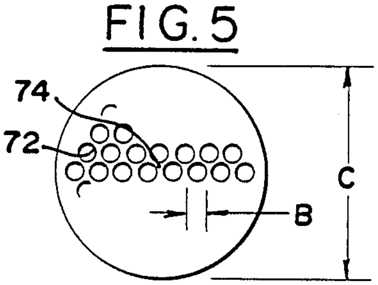
FIG. 5 is a view taken on the line 5—5 of FIG. 4.

FIGS. 4 and 5 illustrate another horn 60 with a rearward portion 62 coupled to a transducer 64, a forward portion 66 that can be coupled to fluid in a chamber, and a middle 68 which is supported as by a flexible mount indicated at 70. The forward portion 66 has a plurality of holes 72 extending parallel to the length and axis of the horn. The horn includes a body 74 in which the holes are formed, and a separate end plate 76 lying over the forward end of the body and over the holes. Both the body 74 and end plate 76 are formed of a rigid metal material such as stainless steel, and the end plate 76 is welded at numerous spaced locations 78 to the body. As indicated in FIG. 5, the numerous axially-extending holes 72 occupy a considerable portion of the cross section of horn as taken perpendicular to its axis 74, leaving less metal to act as a heat conductor to conduct heat in the reverse direction from the front surface 80 of the horn to the transducer 64. Each of the holes 72 is blocked at both of its ends and is of a small diameter B compared to the outside diameter C of the front portion of the horn. This results in a small closed airspace, which minimizes convection currents in the airspace that could transfer heat along the length of the horn. Transference of heat by convection currents within the air space is a potentially greater source of heat transfer between the ends of the horn than radiation and conduction through the air space, and limiting convection currents greatly reduces heat transfer.

FIGS. 6–8 illustrate another horn 90, which includes holes 92 extending transverse to the length of the horn. The holes 92 are arranged in rows, with the rows spaced from one another along the length of the horn, and with holes such as **92*a*, 92*b* in adjacent rows extending perpendicular to one another. As in the other embodiments of the invention, the horn has a sound coupling face 94 which is rigid and substantially continuous (without numerous small holes or bumps therein), and generally flat. The holes lie in the forward portion 96 of the horn, whose rearward portion 98 is coupled to a transducer 100**.

FIG. 8 is a sectional view of part of the forward portion 96 of the horn 90, and including an arrow 102 showing how heat migrates generally along the length of the horn which is parallel to the horn axis 104. The heat path 102 is a sinuous path, since it must zig-zag along the intermediate portions 106 of the horn which lie between rows of holes 92. By thus forming holes perpendicular to the axis of the horn, applicant provides not only a narrow cross section, but also produces a sinuous heat-conducting path which is of extended length.

Applicant has constructed a horn of the type illustrated in FIGS. 6–8, the horn having a width W of 40 mm, and a length L of about 130 mm. The holes 92 had diameters D of about 3.56 mm, and were spaced apart to leave a minimum width of material s of about 0.13 mm (about 5 thousandths inch), with the same spacing occurring between adjacent rows of holes, and with eight holes being placed in each row. The horn was used in an environment of static atmosphere (i.e., no fan or other wind source), to minimize convection currents in the holes. It was found that the horn produced a 60% reduction in heat conduction, as compared to that of a horn of the same dimensions but which was solid (i.e., without any holes). Applicant found that the sound transmission efficiency improved, which is believed to be due to a reduction in the effective cross sectional area having to be vibrated.

FIG. 9 illustrates another levitation system 110 which can use a horn 24 of the prior art to levitate a sample or object 112 in a heated chamber 114. One of the chamber walls 116 is formed with through holes or perforations 118. The sound-coupling forward end surface 120 of the horn is placed adjacent to the chamber wall holes, on the outside of the walls, and is spaced a small distance E from the chamber walls. Vibrations of the horn forward surface 120 produce vibrations in the surrounding air or other gas, which are transmitted through the holes 118 to the gas in the chamber. The holes 118 diverge in a forward direction to account for the fact that sound energy diverges from the face of a horn. The arrangement of FIG. 9 creates two barriers to the transmission of heat are present. One of them is the fact that the perforated chamber wall 116 does not have to be made out of metal to directly conduct sonic vibrations, since the sonic or acoustic energy passes through the holes 118. Another barrier is the space 122 between the surface of the horn and the chamber walls, which is occupied by gas to minimize the conduction of heat. Again, the environment is established to minimize the flow of air or other gas through the space 122 to minimize convection current that would remove heat from the chamber and pass some of it to the horn.

Thus, the invention provides apparatus for transmitting acoustic energy from a transducer along a horn to a chamber that may be heated to a high temperature, while minimizing the reverse transfer of heat from the chamber to the transducer. In one group of arrangements, the horn is perforated to reduce the cross-sectional area along which heat can be conducted, while maintaining a considerable outside diameter of the horn to effectively transfer higher frequency vibrations of a plurality of kilohertz such as over 20 kHz. One arrangement wherein rows of holes extend substantially perpendicular to the length of the horn, is especially useful in reducing heat transfer. In another approach, the heated chamber is perforated in one wall and the forward face of the horn faces the perforations and is preferably slightly spaced therefrom, to pass sound from the horn face through the perforations in the chamber wall to fluid within the chamber.

Although particular embodiments of the invention have been described and illustrated herein, it is recognized that modifications and variations may readily occur to those skilled in the art and consequently it is intended to cover such modifications an equivalents.

We claim:

1. Apparatus for levitating an object and establishing it at a high temperature, comprising:

walls forming a chamber with an inside surface;

means for applying heat to an object lying in said chamber;

a sound-producing transducer;

a horn having a rearward portion coupled to said transducer and a forward portion coupled to said chamber to apply sound energy thereto;

said chamber walls including a perforated wall with a plurality of holes;

said horn having an extreme forward end facing said perforated wall but spaced therefrom.

2. In a sound transmitting horn having a length and an axis extending along its length, for transmitting sound along its length between an acoustic energy-producing transducer and a heated chamber, the improvement wherein:

said horn is formed of rigid material and has rearward and forward portions spaced along said axis for coupling respectively to said transducer and said chamber, said forward portion having a rigid extreme front end forming a continuous solid-to-fluid sound coupling surface and said horn being rigid between said front end and said rearward portion;

said forward portion of said horn having a plurality of rows of holes lying behind said extreme front end and occupying a majority of a cross-sectional area of said horn, each row including a plurality of parallel elongated small diameter holes extending primarily perpendicular to the length of the horn, said rows being spaced along the length of the horn with the holes in each row extending perpendicular to the holes of an adjacent row of holes.

3. Apparatus for levitating an object and establishing it at a high temperature, comprising:

walls forming a chamber with an inside surface;

means for applying heat to an object lying in said chamber;

a sound-producing transducer;

a horn having a rearward portion coupled to said transducer and a forward portion coupled to said chamber to apply sound energy thereto;

said chamber walls including a perforated wall with a plurality of holes;

said horn having an extreme forward end facing said perforated wall but spaced therefrom;

said holes in said perforated chamber wall diverge in a direction away from said horn.

4. In a sound transmitting horn having a length and an axis extending along its length, for transmitting sound along its length between an acoustic energy-producing transducer and a heated chamber while minimizing the reverse flow of heat, the improvement wherein:

said horn has rearward and forward portions spaced along said axis for coupling respectively to said transducer and said chamber, said forward portion having a rigid extreme front end forming a continuous solid-to-fluid sound coupling surface and said horn being rigid between said front and rearward portions said forward portion having a plurality of rows of holes, each row including a plurality of elongated small diameter holes extending primarily perpendicular to the length of the horn, and said rows being spaced along the length of the horn.

5. A sound transmitting apparatus comprising:

a horn having a length and an axis extending along its length, for transmitting sound along its length between an acoustic energy-producing transducer and a heated chamber;

said horn is formed of rigid material and has a rearward portion constructed to couple to a transducer and a forward portion constructed to couple to said chamber, said forward portion having a rigid extreme front end forming a continuous solid-to-fluid sound coupling surface and said horn being rigid between said front and rearward portions;

said horn comprising a unitary body of rigid material extending between said end portions and having a forward end, and a rigid plate lying over said forward end of said body, said body having a plurality of holes extending parallel to said axis which extend rearwardly from the forward end of said body.

* * * * *